United States Patent [19]

Bamber

[11] Patent Number: 4,783,839

[45] Date of Patent: Nov. 8, 1988

[54] IMAGE FILTERING APPARATUS AND METHOD

[75] Inventor: Jeffrey C. Bamber, London, England

[73] Assignee: National Research Development Corporation, London, England

[21] Appl. No.: 903,565

[22] PCT Filed: Dec. 12, 1985

[86] PCT No.: PCT/GB85/00580
§ 371 Date: Aug. 12, 1986
§ 102(e) Date: Aug. 12, 1986

[87] PCT Pub. No.: WO86/03594
PCT Pub. Date: Jun. 19, 1986

[30] Foreign Application Priority Data

Dec. 12, 1984 [GB] United Kingdom ............... 8431374

[51] Int. Cl.$^4$ ............................................ G06K 9/40
[52] U.S. Cl. ...................... 382/54; 358/112; 367/43
[58] Field of Search ................ 358/112; 382/54; 367/43–46, 87–116

[56] References Cited

U.S. PATENT DOCUMENTS 4,012,951 3/1977 Kessler .................................. 367/7
4,038,539 7/1977 Van Cleave ...................... 364/724
4,561,019 12/1985 Lizzi et al. .......................... 358/112

OTHER PUBLICATIONS

Proceedings of the IEEE, vol. 69, No. 1, Jan. 1981 pp. 133–135.
IEEE Transactions on Pattern Analysis and Machine Intelligence, vol. PAMI-2, No. 2, Mar. 1980, pp. 165–168.
IEEE Transactions on Geoscience and Remote Sensing, vol. GE. 22, No. 2 Mar. 1984-pp. 113–120.
IEEE Transactions on Systems, Man and Cybernetics, vol. SMC-7, No. 9, Sep. 1977-pp. 677, 678.
"Speckle Analysis and Smoothing of Synthetic Aperture Radar Images", Computer Graphics and Image Processing 17, 24–32 (1981), by Jong-Sen Lee.

Primary Examiner—John W. Shepperd
Assistant Examiner—Michael D. Parker
Attorney, Agent, or Firm—Cushman, Darby & Cushman

[57] ABSTRACT

In an image processing system for elimination of speckle a signal derived from a scan is passed to a statistical processor (21). An output characteristic of a statistical parameter of the local value of this image signal is passed to a comparator (4) and compared with a reference characteristic of speckle to derive a control signal for a variable bandwidth filter (6) used to enhance the image.

8 Claims, 2 Drawing Sheets

IMAGE FILTERING APPARATUS AND METHOD

BACKGROUND OF THE INVENTION

The present invention relates to filtering and, more particularly to filtering images.

The fine structure (texture) of ultrasound pulse-echo images has a mottled or granular appearance which has been called speckle because of its similarity to the equivalent optical phenomenon, laser speckle. The phenomenon of speckle results directly from the use of a coherent radiation for imaging and occurs when structure in the object (in this case the body), on a scale too small to be resolved by the imaging system, causes interference to occur between different parts of the wave received from the object region corresponding to a given point in the image. The term "speckle" as used in this specification is intended to include speckle in ultrasound pulse-echo images as well as similar phenomena in images obtained using other coherent radiation sources.

When the ultrasonic scatters are random and finely distributed the speckle generated is known as "fully developed speckle". It has a mean and modal value determined by the strength of the scattering but all other properties are independent of the object structure and are characteristic of the instrument used to produce the image. Both the amplitude (grey level) probability distribution and the average speckle cell will have a shape determined by the instrument, which may vary within the image.

It is now agreed by many authors that it would be desirable to remove, or reduce, the speckle in pulse-echo images since its presence degrades the apparent resolution in the image to a point well below the diffraction predicted value and it interferes with the visual assessment of small differences in mean grey level or texture. A number of methods have been suggested for achieving this, most of the methods involving the averaging or multiple images of the same object structure, varying one or more instrument parameters so that the speckle patterns in the images are significantly decorrelated. This reduces the variance of the speckle modulation and thus makes the mean level and object texture easier to perceive. Additionally it is possible to reduce the variance of the speckle by smoothing the image with two-dimensional low pass filtering. A simple filter (even one which varies spatially to account for the spatial variation of the speckle characteristics) will, however, also blur the object related information which one would wish to preserve. To date, post-formation image filtering methods have not been successfully applied to remove speckle from ultrasonic pulse-echo images.

What is described herein is to be distinguished from two previous publications. Firstly, the specific embodiment described to illustrate the utility of the method resembles a multiplicative noise filter developed by Lee ("Speckle analysis and smoothing of synthetic radar images" Computer Graphics and Image Processings 17 24–25 (1981)) to smooth synthetic aperture radar images, which also suffer from speckle. The differences are that the example given above is intended to only illustrate a general class of "intelligent" filters based on a multivariate description of speckle and they are not limited simply to filtering multiplicative noise. Furthermore, there are some specific differences in the definition of the value of the constant, k, and in the manner of derivation of the filter.

Secondly, Dickinson ("Reduction of speckle and ultrasound B-scans by digital processing" Acoustical Images 213–224 (Plenum Press)) has attempted to smooth speckle in ultrasound pulse-echo images using an unsharp masking filter where the coefficient k is controlled by the local mean, $\bar{x}$, only. This attempt, which was designed to preserve large amplitude echoes from discrete structures such as blood vessels appeared to be relatively unsuccessful and certainly would not have been able to cope with two different texture regions which possessed the same mean level. The local means is not a parameter which can be used to recognise fully developed speckle. It is in fact the only speckle characteristic which is determined by the object. Thus any resemblence to the work of Dickinson is entirely superficial since the class of filters described here have quite a different derivation and a different application to that which he described.

SUMMARY OF THE INVENTION

Broadly, the present invention provides a method for filtering an image to reduce the occurrence of speckle which involves determining how closely individual regions of the image resemble speckle and filtering the image regions in accordance with that determination.

Thus, the invention provides a method of filtering an image from an imaging system which is prone to speckle generation comprising the steps of identifying one or more properties of an image region which is a measure of the characteristic speckle of the apparatus for that image region, determining the extent to which the corresponding regions of a particular image requiring filtering resembles speckle normally generated by the imaging system in that part of the image and filtering the image in accordance with the extent to which said image resembles speckle.

The invention further provides apparatus adapted to carry out the method of this invention. Assuming the speckle characteristics of the image regions have been established, the filtering apparatus need only include means for carrying out steps (2) and (3).

The filtering may involve spatial filtering of the image regions with a filter whose shape is varied in accordance with the results of step (2). Suitably, the filtering involves smoothing the regions of the image by amounts which vary in accordance with the results of step (2), preferably such that the degree of smoothing of a particular region is increased, the more closely that image region resembles speckle. Regions most closely resembling speckle may be replaced by a local image mean value; at the other extreme, those regions least resembling speckle may be left unsmoothed.

The invention, the principles of which will now be described, can thus provide a method by which ultrasonic pulse-echo images may be smoothed to suppress the fully developed speckle (as defined above) whilst substantially preserving the image component corresponding to resolved (or partially resolved) object structure.

BRIEF DESCRIPTION OF THE DRAWINGS

The invention will be further described by way of example with reference to the accompanied drawings in which.

DESCRIPTION OF THE PREFERRED EMBODIMENTS

Figure 1A:
FIGS. 1a and 1b show an image derived from pulse-echo ultrasonic scanner respectively without and with filtering in accordance with the present invention.

The fully developed speckle, as described above, occurs when many fine scattering sites exist within the resolution cell of the pulse-echo system. Deviations from this situation (i.e. as resolvable, or partially resolvable, structure is introduced) result in deviations in the statistical properties of the image texture. Such deviations result in an image texture which is no longer entirely characteristic of the imaging system. The method of the present invention is that of using these deviations to classify each local region of the image according to how much it resembles the fully developed speckle normally generated by that particular imaging system in that part of the image. This measure of similarity is then used to control the shape of a smoothing filter of any suitable kind so that regions of the image which closely resemble the fully developed speckle are replaced by a local mean value and, at the other extreme, regions with properties which are least similar to fully developed speckle are not smoothed. Thus the filter appears to behave intelligently by recognising those parts of the image which require maximum smoothing. The means of combining suitable features of the local image texture to form a measure of similarity may be any appropriate to the circumstances. The use of different numbers and combinations of speckle-recognition features will result in a family of filters operating by this method, each offering a different compromise between effectiveness of speckle suppression, loss of real information and speed of computation. (It is expected that some of these filters will prove simple enough to be implemented in hardware or software so that the transformation from the pre-processed image to the processed image can be achieved in what is called "real time", i.e. faster than about 10⁷ pixels per second. Such developments are intended by the inventor and are also covered by the invention.) The simplest method is to use one, normalised, feature only.

To illustrate the utility of this processing method an example will now be given of one implementation of this kind of filter. In this example one feature only is used to classify the texture and the measure of similarity is simply a scaled, normalised value of the feature itself. Also for the purposes of illustration this example used the method of unsharp masking to provide a convenient way of allowing the degree of smoothing to be varied. This is defined by $$\hat{x} = \bar{x} + k(x - \bar{x}) \quad (i)$$

where $\hat{x}$ is the new processed value of a pixel to be computed from the old unprocessed value, $x$, and the local mean of the old values surrounding and including that pixel, $\bar{x}$. The constant, $k$, is controlled by the measure of similarity used, $p$, which in this case is the deviation in the ratio of the local variance of grey levels to the local mean, $p = \mathrm{var}(x)/\bar{x}$;

$$k = (ap - \bar{p}s)/p$$

where $\bar{p}s$ is the mean value of $p$ in a region of an image which is considered (by human observation) to consist entirely of fully developed speckle. This may be a region in part of the image to be processed but is more likely to be part of an image obtained using the same instrument to scan a specifically constructed phantom consisting of the randomly dispersed fine distribution of scatters known to produce fully developed speckle. The constant, a, is a scaling factor which permits the overall agressiveness of the smoothing to be adjusted.

Figure 1B:

It may be seen from equation (i) that regions of the image which have a value of the similarity coefficient, $p$, which is close to that of fully developed speckle, $\bar{p}s$, will receive the maximum amount of smoothing, which is defined by the value of a and the number of pixels over which $\bar{x}$ is computed. FIG. 1b illustrates the results of applying this processing technique to the ultrasonic image of a human liver and kidney shown in FIG. 1a. It is readily apparent from studying the two images that the object of suppressing the speckle whilst preserving useful information has, in large measure, been achieved. It is expected that the use of appropriate combinations of more texture featurees will produce even better results.

Figure 2:
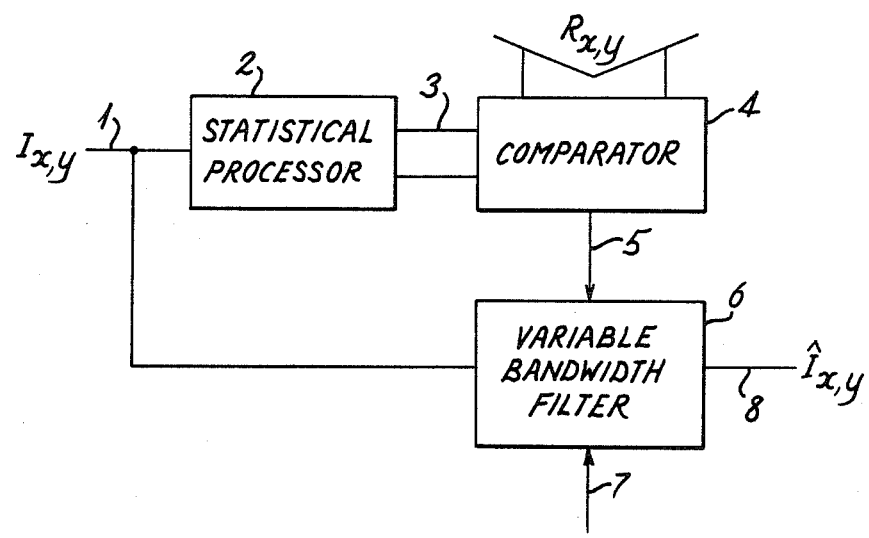
FIG. 2 is a block diagram of one form of filter in accordance with the present invention.

FIG. 2 shows special-purpose-hardware implementation of the present invention. Image information derived from ultrasonic pulse-echo scanning is applied as a signal $I_{x,y}$ to an input 1 of the apparatus and delivered to a statistical processor 2. This processor outputs via lines 3 one or more signals representing statistical characteristics of the image information relevant to the identification of speckle. This signal or signals is/are applied to a comparator 4 which compares them with signals $R_{x,y}$ representative of the known statistical chracteristics of speckle of the imaging system in question in that image region. A signal representing the degree of similarity between the image information and the reference information is applied to the bandwidth control input of a variable bandwidth spatial filter 6 which also receives, as input for filtering, the image information $I_{x,y}$. The filter may, if desired, be provided with a second control input 7 to control the depth and/or rate of the filtering.

The filtered image signal appears $\hat{i}_{x,y}$ at an output 8.

The filter shown in FIG. 2 may be used to implement the above described or any other desired filtering algorithm in accordance with the present invention.

An adaptive two-dimensional filter for the suppression of speckle from ultrasonic pulse-echo images, based on the use of the ratio of the local variance and local mean of the image to recognise those parts of the image which require maximum and minimum smoothing, has been found to perform well in preliminary tests on clinical images. In this particular embodiment, an image was scanned, with an intantaneous reactant of a 3×3 pixel matrix. The signals from individual pixels were processed in real time to obtain the local variance and the local mean, prior to image processing by means of the variable bandwidth filter.

Further developments of this approach to filtering ultrasonic images include the use of reference speckle patterns which are spatially variant to allow the filter to deal effectively with the spatial variation of the speckle characteristics of the imaging system. Such reference images could be obtained from phantoms constructed to produce fully developed speckle and to mimic the frequency dependent attenuation typical of soft tissues. However, the need for such developments may be somewhat offset by two features of current medical ultrasound scanner design. Firstly, in one popular class of scanners the image is produced by sweeping the sound beam through a circular sector. A polar co-ordinate version of the filter would permit much of the far-field (beam spreading) spatial variation of speckle in sector scans to be automatically accounted for. Secondly, some scanners now incorporate highly sophisticated multiple zone of swept focus systems designed to maintain good lateral resolution over a wide depth range. These systems tend to produce spatially more uniform speckle patterns.

I claim:

1. A method of filtering an image from an imaging system which is prone to speckle generation comprising the steps of identifying one or more properties of an image region which is a measure of speckle characteristic of the apparatus for that image region, determining the extent to which corresponding regions of a particular image requiring filtering resembles speckle normally generated by the imaging system in that part of the image and filtering the image in accordance with the extent to which said image resembles speckle.

2. A method of filtering an image as claimed in claim 1 replacing the image in regions which resemble substantially fully developed speckle by a local mean value.

3. A method of filtering an image as claimed in claim 1 wherein a signal derived by scanning an object is fed to a statistical processor which has at least one outupt giving a signal dependent on the speckle characteristics of the image and wherein said the signal from said output is fed to a comparator which compares it with reference information comprising a signal representative of known statistical characteristics of speckle of the imaging system in said imaging region.

4. A method of filtering an image as claimed in claim 3 wherein a control signal representing the degree of similarity between image information derived from said image regime and said reference information is derived from said comparator.

5. A method of filtering an image as claimed in claim 4 wherein said control signal is fed to the bandwidth control of a variable bandwidth filter to control image information of an image signal fed thereto.

6. A method of filtering an image as claimed in claim 1 wherein said control signal is derived by comparing the local mean with the local variance of the image.

7. A method of filtering an image as claimed in claim 1 wherein a reference is derived from a phantom constructed to produce substantially fully developed speckle.

8. Apparatus for filtering an image from an imaging system comprising statistical processor means to derive a signal dependent on a statistical characteristic of this image information relevant to the identification of speckle and comparator means to compare said signal with a predetermined reference signal to produce a control signal to vary the characteristics of a variable bandwidth filter for processing a signal derived from said images.

* * * * *